United States Patent
Ma et al.

(10) Patent No.: US 11,768,264 B2
(45) Date of Patent: Sep. 26, 2023

(54) SYSTEM AND METHOD FOR MAGNETIC RESONANCE FINGERPRINTING WITH RELAXATION AND DIFFUSION DATA ACQUISITION

(71) Applicants: Case Western Reserve University, Cleveland, OH (US); University College Cardiff Consultants Limited, Cardiff (GB)

(72) Inventors: Dan Ma, Solon, OH (US); Mark A. Griswold, Shaker Heights, OH (US); Derek Jones, Cardiff (GB); Maryam Afzali, Cardiff (GB); Lars Mueller, Cardiff (GB)

(73) Assignees: Case Western Reserve University, Cleveland, OH (US); University College Cardiff Consultants Limited Cardiff, Cardiff (GB)

( * ) Notice: Subject to any disclaimer, the term of this patent is extended or adjusted under 35 U.S.C. 154(b) by 0 days.

(21) Appl. No.: 17/661,736

(22) Filed: May 2, 2022

(65) Prior Publication Data
US 2022/0349971 A1  Nov. 3, 2022

Related U.S. Application Data

(60) Provisional application No. 63/201,465, filed on Apr. 30, 2021.

(51) Int. Cl.
*G01R 33/50* (2006.01)
*G01R 33/563* (2006.01)
*G01R 33/56* (2006.01)

(52) U.S. Cl.
CPC ......... *G01R 33/50* (2013.01); *G01R 33/5608* (2013.01); *G01R 33/56341* (2013.01)

(58) Field of Classification Search
CPC ............... G01R 33/50; G01R 33/5608; G01R 33/56341
See application file for complete search history.

(56) References Cited

U.S. PATENT DOCUMENTS

| | | | |
|---|---|---|---|
| 8,723,518 B2 | 5/2014 | Seiberlich et al. | |
| 10,613,183 B2 * | 4/2020 | Huwer | G01R 33/56341 |

(Continued)

OTHER PUBLICATIONS

Benjamini, Dan, and Peter J. Basser. "Magnetic resonance microdynamic imaging reveals distinct tissue microenvironments." NeuroImage 163 (2017): 183-196.

(Continued)

*Primary Examiner* — Gregory H Curran
(74) *Attorney, Agent, or Firm* — Quarles & Brady LLP

(57) ABSTRACT

A method for multi-dimensional, relaxation-diffusion magnetic resonance fingerprinting (MRF) includes performing, using a magnetic resonance imaging (MRI) system, a pulse sequence that integrates free-waveform b-tensor diffusion encoding into a magnet resonance fingerprinting pulse sequence to perform a multi-dimensional, relaxation-diffusion encoding while acquiring MRF signal evolutions, processing, using a processor, the acquired MRF signal evolutions to determine at least one relaxation parameter and at least one diffusivity parameter, and generating, using the processor, a report including at least one of the at least one relaxation parameter and the at least diffusivity parameter.

17 Claims, 6 Drawing Sheets

(56) References Cited

U.S. PATENT DOCUMENTS

2015/0301141 A1    10/2015  Griswold et al.
2016/0291113 A1*   10/2016  Stemmer .......... G01R 33/56341
2020/0284865 A1*    9/2020  Szczepankiewicz .......................
                                                        G01R 33/4822

OTHER PUBLICATIONS

Bernin, Diana, and Daniel Topgaard. "NMR diffusion and relaxation correlation methods: New insights in heterogeneous materials." Current opinion in colloid & interface science 18.3 (2013): 166-172.

Callaghan, Paul T., C. D. Eccles, and Y. Xia. "NMR microscopy of dynamic displacements: k-space and q-space imaging." Journal of Physics E: Scientific Instruments 21.8 (1988): 820.

De Almeida Martins, João P., and Daniel Topgaard. "Multidimensional correlation of nuclear relaxation rates and diffusion tensors for model-free investigations of heterogeneous anisotropic porous materials." Scientific reports 8.1 (2018): 2488.

De Santis, Silvia, et al. "Improved precision in CHARMED assessment of white matter through sampling scheme optimization and model parsimony testing." Magnetic resonance in medicine 71.2 (2014): 661-671.

Henriques, Rafael Neto, Sune N. Jespersen, and Noam Shemesh. "Microscopic anisotropy misestimation in spherical-mean single diffusion encoding MRI." Magnetic resonance in medicine 81.5 (2019): 3245-3261.

Hubbard, Penny L., et al. "Biomimetic phantom for the validation of diffusion magnetic resonance imaging." Magnetic resonance in medicine 73.1 (2015): 299-305.

Jespersen, Sune Nørhøj. "Equivalence of double and single wave vector diffusion contrast at low diffusion weighting." NMR in Biomedicine 25.6 (2012): 813-818.

Kim, Daeun, et al. "Diffusion-relaxation correlation spectroscopic imaging: a multidimensional approach for probing microstructure." Magnetic resonance in medicine 78.6 (2017): 2236-2249.

Lampinen, Björn, et al. "Towards unconstrained compartment modeling in white matter using diffusion-relaxation MRI with tensor-valued diffusion encoding." Magnetic resonance in medicine 84.3 (2020): 1605-1623.

Le Bihan, Denis, et al. "MR imaging of intravoxel incoherent motions: application to diffusion and perfusion in neurologic disorders." Radiology 161.2 (1986): 401-407.

Ma, Dan, et al. "Magnetic resonance fingerprinting." Nature 495. 7440 (2013): 187-192.

Mezer, Aviv, et al. "Quantifying the local tissue volume and composition in individual brains with magnetic resonance imaging." Nature medicine 19.12 (2013): 1667-1672.

Mitra, Partha P. "Multiple wave-vector extensions of the NMR pulsed-field-gradient spin-echo diffusion measurement." Physical Review B 51.21 (1995): 15074.

Sjölund, Jens, et al. "Constrained optimization of gradient waveforms for generalized diffusion encoding." Journal of magnetic resonance 261 (2015): 157-168.

Stejskal, E. O. "Use of spin echoes in a pulsed magnetic-field gradient to study anisotropic, restricted diffusion and flow." The Journal of Chemical Physics 43.10 (1965): 3597-3603.

Szczepankiewicz, Filip, et al. "The link between diffusion MRI and tumor heterogeneity: Mapping cell eccentricity and density by diffusional variance decomposition (DIVIDE)." Neuroimage 142 (2016): 522-532.

Veraart, Jelle, Dmitry S. Novikov, and Els Fieremans. "TE dependent Diffusion Imaging (TEdDI) distinguishes between compartmental T2 relaxation times." NeuroImage 182 (2018): 360-369.

Westin, Carl-Fredrik, et al. "Q-space trajectory imaging for multi-dimensional diffusion MRI of the human brain." Neuroimage 135 (2016): 345-362.

Yang, Grant, and Jennifer A. McNab. "Eddy current nulled constrained optimization of isotropic diffusion encoding gradient waveforms." Magnetic resonance in medicine 81.3 (2019): 1818-1832.

* cited by examiner

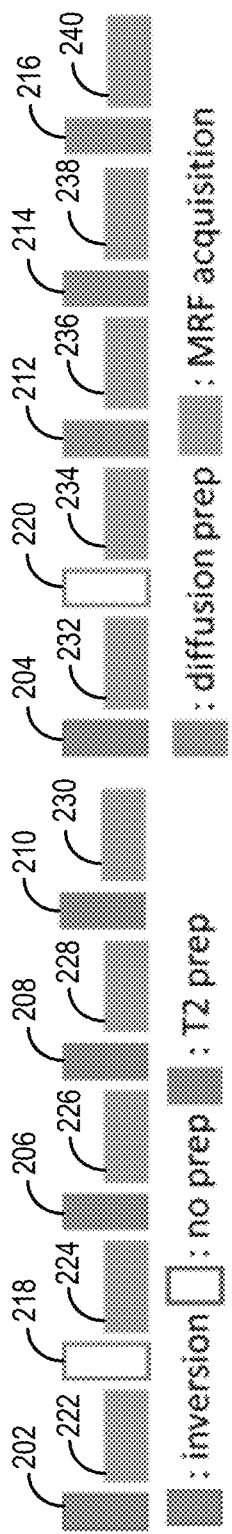
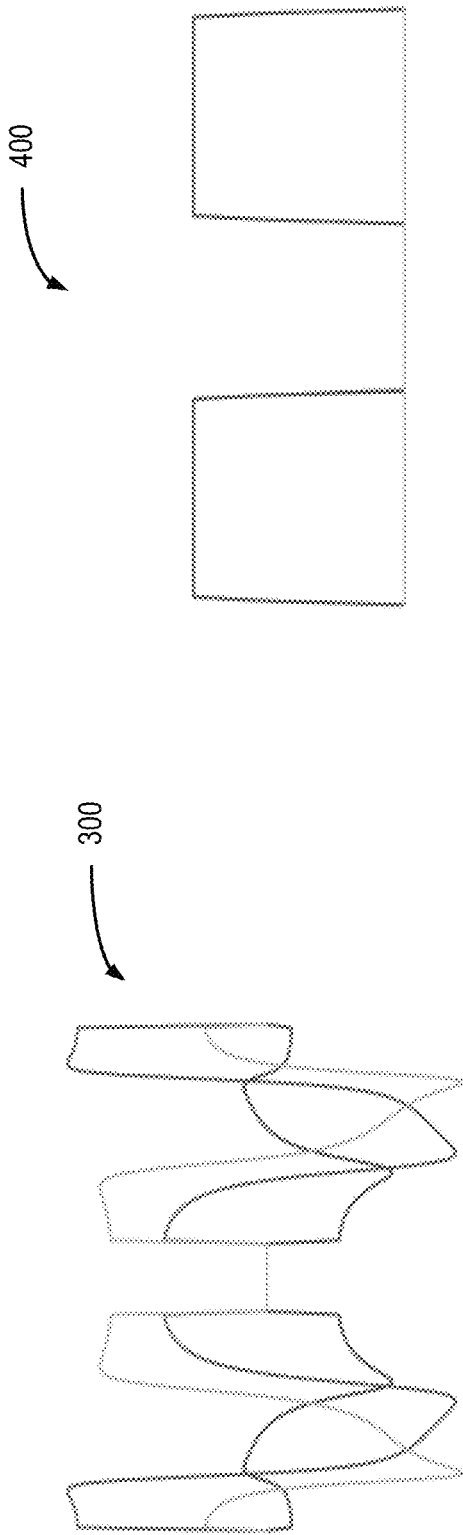
FIG. 2
FIG. 3
FIG. 4

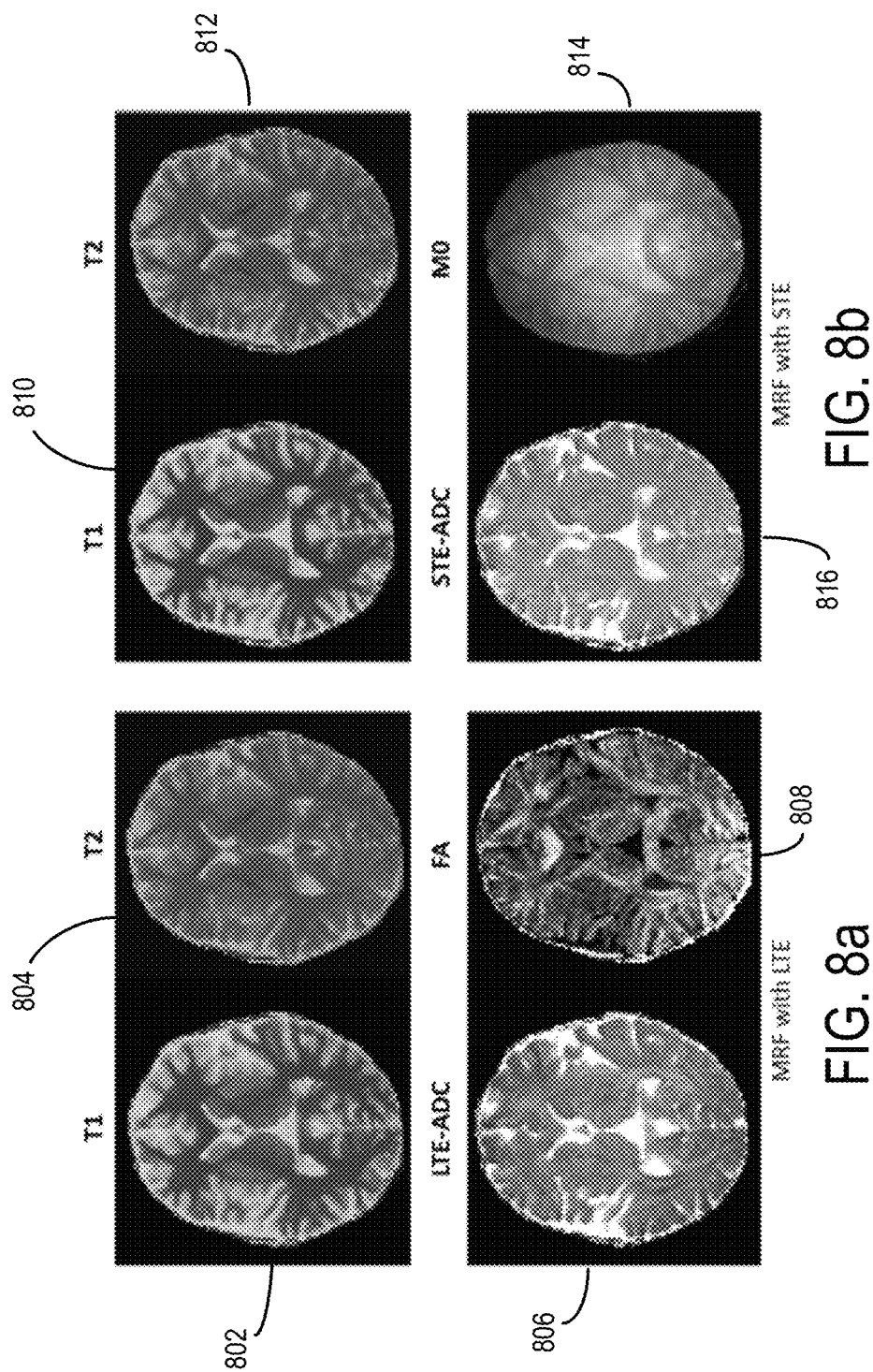

SYSTEM AND METHOD FOR MAGNETIC RESONANCE FINGERPRINTING WITH RELAXATION AND DIFFUSION DATA ACQUISITION

CROSS-REFERENCE TO RELATED APPLICATIONS

This application is based on, claims priority to, and incorporates herein by reference in its entirety U.S. Ser. No. 63/201,465 filed Apr. 30, 2021 and entitled "System and Method for Magnetic Resonance Fingerprinting with Relaxation and Diffusion Data Acquisition."

STATEMENT REGARDING FEDERALLY SPONSORED RESEARCH OR DEVELOPMENT

This invention was made with government support under EB026764 and NS109439 awarded by the National Institutes of Health. The government has certain rights in the invention.

BACKGROUND

The present disclosure relates generally to systems and methods for nuclear magnetic resonance (NMR) techniques and processes and, more particularly, systems and methods for using magnetic resonance fingerprinting (MRF) to acquire both relaxation and diffusion data.

Characterizing tissue species using nuclear magnetic resonance ("NMR") can include identifying different properties of a resonant species (e.g., $T_1$ spin-lattice relaxation, $T_2$ spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," Nature, 2013; 495 (7440): 187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a $T_1$-weighted signal at a first echo time ("TE"), while a second pulse sequence may produce a $T_2$-weighted signal at a second TE. These conventional pulse sequences typically provide qualitative results where data are acquired with various weighting or contrasts that highlight a particular parameter (e.g., $T_1$ relaxation, $T_2$ relaxation).

When magnetic resonance ("MR") images are generated, they may be viewed by a radiologist and/or surgeon who interprets the qualitative images for specific disease signatures. The radiologist may examine multiple image types (e.g., $T_1$-weighted, $T_2$ weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known signal evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

Diffusion magnetic resonance imaging (dMRI) is a powerful tool to investigate tissue microstructure. dMRI measures the random motion of water molecules in tissues and provides information about the microstructural features of the tissue including, for example, the functional architecture of tissues. dMRI has been used to investigate neurological disorders such as brain ischemia and has been used to image other organs. Microstructure imaging techniques based on tensor-valued diffusion encoding have gained popularity. Unlike conventional diffusion encoding, which employs encoding applied along a single direction in each shot, tensor-valued encoding employs diffusion encoding along multiple directions within a single preparation of the signal. The benefit is that such encoding can probe tissue features that are not accessible by conventional encoding.

Disentangling the compartmental properties of the tissue is degenerate using dMRI alone. Thus, several works have suggested the combination of dMRI with relaxometry to disentangle the compartmental effects, such as Veraart, Jelle et al. "TE dependent Diffusion Imaging (TEdDI) distinguishes between compartmental T2 relaxation times," NeuroImage 182 (2018): 360-369. Recent studies, such as Mitra, Partha P. "Multiple wave-vector extensions of the NMR pulsed-field-gradient spin-echo diffusion measurement," Physical Review B 51.21 (1995): 15074, have also shown that using the conventional Stejskal-Tanner encoding has a fundamental drawback because the effect of isotropic diffusivity, dispersion, and microscopic anisotropy are mixed together. B-tensor encoding was proposed in Westin, Carl-Fredrik, et al. "Q-space trajectory imaging for multidimensional diffusion MRI of the human brain." Neuroimage 135 (2016): 345-362. to mitigate this problem and different combinations of $T_1$, $T_2$, and diffusion, with and without b-tensor encoding, were used in several studies, including, Mitra, Partha P. "Multiple wave-vector extensions of the NMR pulsed-field-gradient spin-echo diffusion measurement." Physical Review B 51.21 (1995): 15074. For example, microscopic fractional anisotropy (µFA) that can be extracted from the combination of linear tensor encoding (LTE) and spherical tensor encoding (STE) is a useful measure of anisotropy at the microscopic level when the conventional fractional anisotropy (FA) is not able to present the anisotropy in the underlying microstructure properly. One of the main challenges of in vivo applications of joint relaxometry-diffusion is the long acquisition times.

SUMMARY OF THE DISCLOSURE

In accordance with an embodiment, a method for multi-dimensional, relaxation-diffusion magnetic resonance fingerprinting (MRF) includes performing, using a magnetic resonance imaging (MRI) system, a pulse sequence that integrates free-waveform b-tensor diffusion encoding into a magnet resonance fingerprinting pulse sequence to perform a multi-dimensional, relaxation-diffusion encoding while acquiring MRF signal evolutions, processing, using a processor, the acquired MRF signal evolutions to determine at least one relaxation parameter and at least one diffusivity parameter, and generating, using the processor, a report including at least one of the at least one relaxation parameter and the at least one diffusivity parameter.

In accordance with another embodiment, magnetic resonance imaging (MRI) system includes a magnet system configured to generate a polarizing magnetic field about a portion of a subject positioned, a magnetic gradient system including a plurality of magnetic gradient coils configured to apply at least one magnetic gradient field to the polarizing magnetic field, a radio frequency (RF) system configured to apply an RF excitation field to the subject, and to receive magnetic resonance signals from the subject using a coil array and at least one processor. The processor may be configured to perform a pulse sequence that integrates free-waveform b-tensor diffusion encoding into a magnet resonance fingerprinting pulse sequence to perform a multi-dimensional, relaxation-diffusion encoding while acquiring MRF signal evolutions and process the MRF signal evolutions to determine at least one relaxation parameter and at least one diffusivity parameter.

BRIEF DESCRIPTION OF THE DRAWINGS

The present invention will hereafter be described with reference to the accompanying drawings, wherein like reference numerals denote like elements.

FIG. 2 illustrates a pulse sequence for multi-dimensional, relaxation-diffusion magnetic resonance fingerprinting (MRF) in accordance with an embodiment;

FIG. 3 illustrates an example spherical tensor encoding (STE) gradient waveform in accordance with an embodiment;

FIG. 4 illustrates and example linear tensor encoding (LTE) gradient waveform in accordance with an embodiment;

FIG. 8A shows example $T_1$, $T_2$, ADC and fractional anisotropy (FA) for a multi-dimensional, relaxation-diffusion MRF acquisition using LTE in accordance with an embodiment; and FIG. 8B shows example $T_1$, $T_2$, ADC and proton density ($M_0$) for a multi-dimensional, relaxation-diffusion MRF acquisition using STE in accordance with an embodiment.

DETAILED DESCRIPTION

Figure 1:
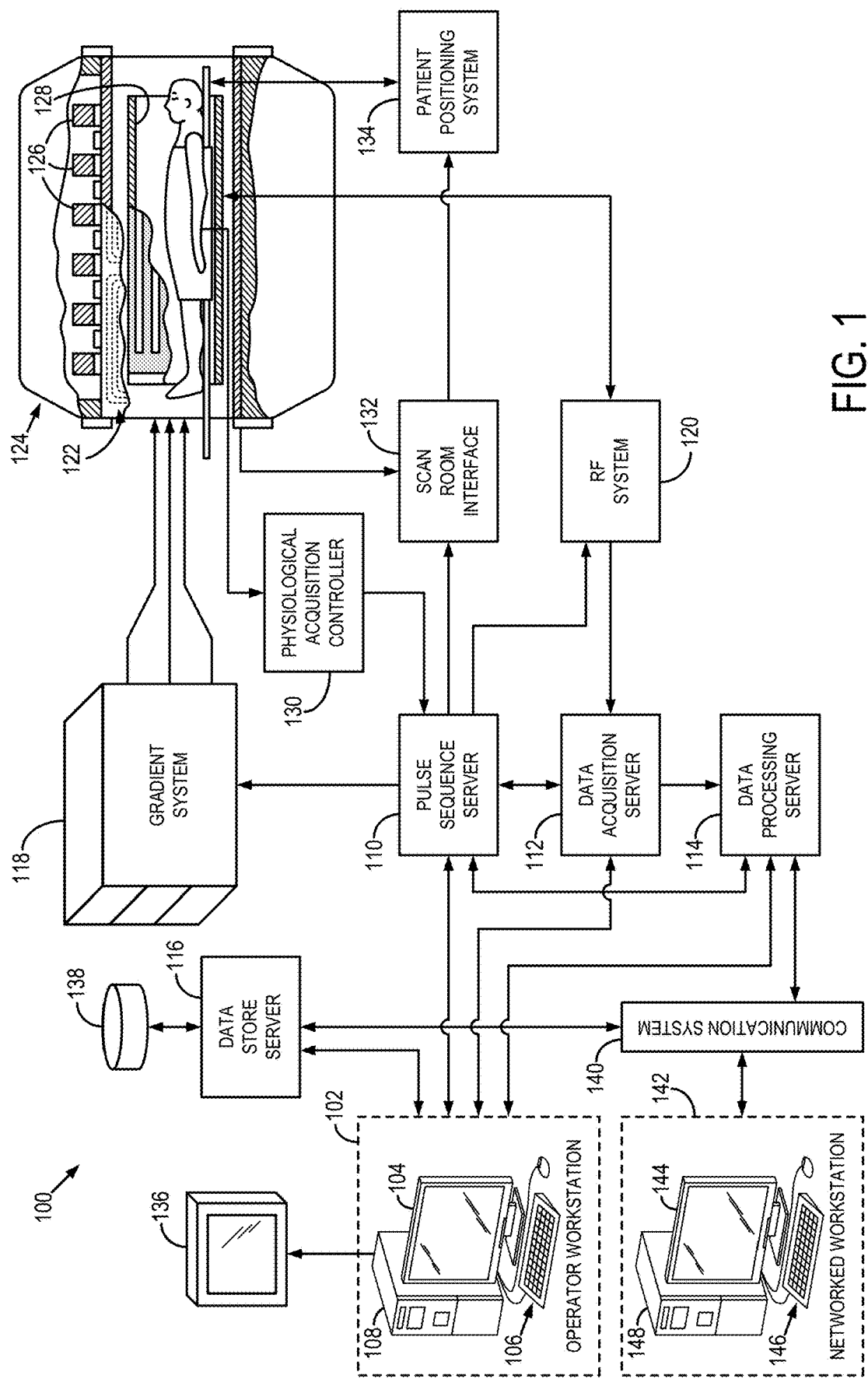
FIG. 1 is a schematic diagram of an example MRI system in accordance with an embodiment.

Magnetic resonance fingerprinting ("MRF") is a technique that facilitates mapping of tissue or other material properties based on random or pseudorandom measurements of the subject or object being imaged. In particular, MRF can be conceptualized as evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters or properties. Examples of such parameters or properties that can be mapped may include, but are not limited to, tissue parameters or properties such as longitudinal relaxation time ($T_1$), transverse relaxation time ($T_2$), and proton density ($M_0$), and device dependent parameters such as main or static magnetic field map ($B_0$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical properties, such as those mentioned above. As an example, the comparison of the acquired signals to a dictionary can be performed using any suitable matching or pattern recognition technique. The properties for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative properties, which can be extracted from the selected signal vector and used to generate the relevant quantitative property maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $\beta$ is off resonance, $R_i(\beta)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion parameter; $E_i(T_1,T_2,D)$ is a signal decay due to relaxation and diffusion; and $M_0$ is the magnetization in the default or natural alignment to which spins align when placed in the main magnetic field.

While $E_i(T_1,T_2,D)$ is provided as an example, in different situations, the decay term, $E_i(T_1,T_2,D)$, may also include additional terms, $E_i(T_1,T_2,D, \ldots)$ or may include fewer terms, such as by not including the diffusion parameters, as $E_i(T_1,T_2)$ or $E_i(T_1, T_2, \ldots)$. Also, the summation on "j" could be replace by a product on "j". The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation, diffusion, and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as $T_1$ or $T_2$ or diffusivity or diffusion tensor as well as acquisition parameters like flip angle (FA), repetition time (TR), diffusion b values and directions. This signal timecourse can, thus, be referred to as a signal evolution and each pixel can be matched to an entry in the dictionary, which is a collection of possible signal evolutions or timecourses calculated using a range of possible tissue property values and knowledge of the quantum physics that govern the signal evolution. Upon matching the measured signal evolution/timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

To achieve this process, a magnetic resonance imaging (MRI) system or nuclear magnetic resonance (NMR) system may be utilized. FIG. 1 shows an example of an MRI system 100 that may be used to perform magnetic resonance fingerprinting. In addition, MRI system 100 may be used to implement the methods described herein. MRI system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (3);$$

and the phase of the received magnetic resonance signal may also be determined according to the following relationship:

$$\varphi = \tan^{-1}\left(\frac{Q}{I}\right). \quad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

As discussed above, MRF is a fast, quantitative imaging technique that is able to quantify multiple tissue parameters simultaneously. Variation of the b-tensor shape can be central to probing, for example, microscopic anisotropy. The present disclosure describes systems and methods for magnetic resonance fingerprinting (MRF) that integrates free-waveform b-tensor diffusion encoding into an MRF pulse sequence. Accordingly, a multi-dimensional, relaxation-diffusion encoding may be performed while acquiring MRF data (i.e., MRF signal evolutions) to achieve a multi-dimensional, relaxation-diffusion MRF (md-MRF) acquisition. Advantageously, the disclosed MR fingerprinting pulse sequence with b-tensor encoding may be used for simultaneous relaxation and diffusion mapping in a single scan. In some embodiments, the disclosed multi-dimensional, relaxation-diffusion MRF technique can simultaneously quantify relaxation and diffusion parameters and properties such as, for example, $T_1$, $T_2$, diffusivity or diffusion tensor, and proton density ($M_0$). In some embodiments, the diffusivity or diffusion tensor may be used to measure quantitative parameters such as, for example, apparent diffusion coefficient (ADC), fractional anisotropy (FA), microscopic fractional anisotropy (FA), or other microstructure related parameters. In some embodiments, the free-waveform b-tensor encoding can effectuate multiple geometries of b-tensor gradient encoding. For example, in some embodiments, the multiple geometries of b-tensor encoding can include one or more of linear tensor encoding, spherical tensor encoding and other b-tensor gradient waveforms. For example, in some embodiments, multiple b-tensor encoding with different b-values (e.g., b=0, 200, 800, 1300 s/mm$^2$) and different diffusion rotation directions (e.g., 6, 20, 64 directions) can be included in a single scan. In some embodiments, multiple diffusion or non-diffusion preparation modules can be included in a single scan or multiple scans to encode multi-dimensional tissue parameter space. The location or order of the preparation modules can be randomly or optimally designed.

The present disclosure describes systems and methods to extract relaxation parameters (e.g., $T_1$ and $T_2$ relaxation times) simultaneously with the diffusion parameters (e.g., ADC, FA, μFA) in the presence of b-tensor encoding in MRF. This application of free gradient waveforms to MRF provides these and other advantages not otherwise realized previously. In some embodiments, the disclosed systems and methods may be used for imaging of organs such as, for example, the brain. In some embodiments, the disclosed systems and methods may be used for clinical studies for tumor investigation.

FIG. 2 illustrates a pulse sequence for multi-dimensional, relaxation-diffusion magnetic resonance fingerprinting (MRF) in accordance with an embodiment. It should be understood that the pulse sequence 200 shown in FIG. 2 is a non-limiting example of a pulse sequence for performing md-MRF. As shown in FIG. 2, in some embodiments, the pulse sequence 200 can include multiple preparation modules (or units) including inversion preparations 202, 204, which can use multiple interval times ($T_1$). The preparation modules can also include $T_2$ preparation modules 206-210, for example, with multiple echo times (TE). Furthermore, the preparation modules can include diffusion preparation modules 212-216, which can include multiple b-shells. Where no preparation module is included, a "no-prep" period 218, 220 can be inserted. As shown in FIG. 2, in some embodiments, after each preparation module 202-222, MRF data can be acquired using an MRF acquisition module (or unit) 222-240. The MRF acquisition modules 222-240, for example, can be performed to acquire MRF data with varying flip angles. In some embodiments, the MRF acquisition modules 222-240 can use single-shot spiral readouts.

As mentioned above, in some embodiment, the md-MRF pulse sequence 200 may be implemented with one or more b-tensor diffusion encoding geometries such as, for example, linear tenor encoding (LTE) and spherical tensor encoding (STE). FIG. 3 illustrates an example spherical tensor encoding (STE) gradient waveform in accordance with an embodiment. The example STE gradient waveform 300 may be integrated into and used in, for example, the diffusion preparation modules 212-216 of md-MRF sequence 200 shown in FIG. 2. FIG. 4 illustrates and example linear tensor encoding (LTE) gradient waveform in accordance with an embodiment. The example LTE gradient waveform 400 may be integrated into and used in, for example, the diffusion preparation modules 212-216 of md-MRF sequence 200 shown in FIG. 2. In some embodiments, for an md-MRF sequence 200 including diffusion preparation modules 212-216 with an LTE gradient waveform, the acquisition modules 212-216 may be repeated multiple times with varying sampling directions.

Figure 5:
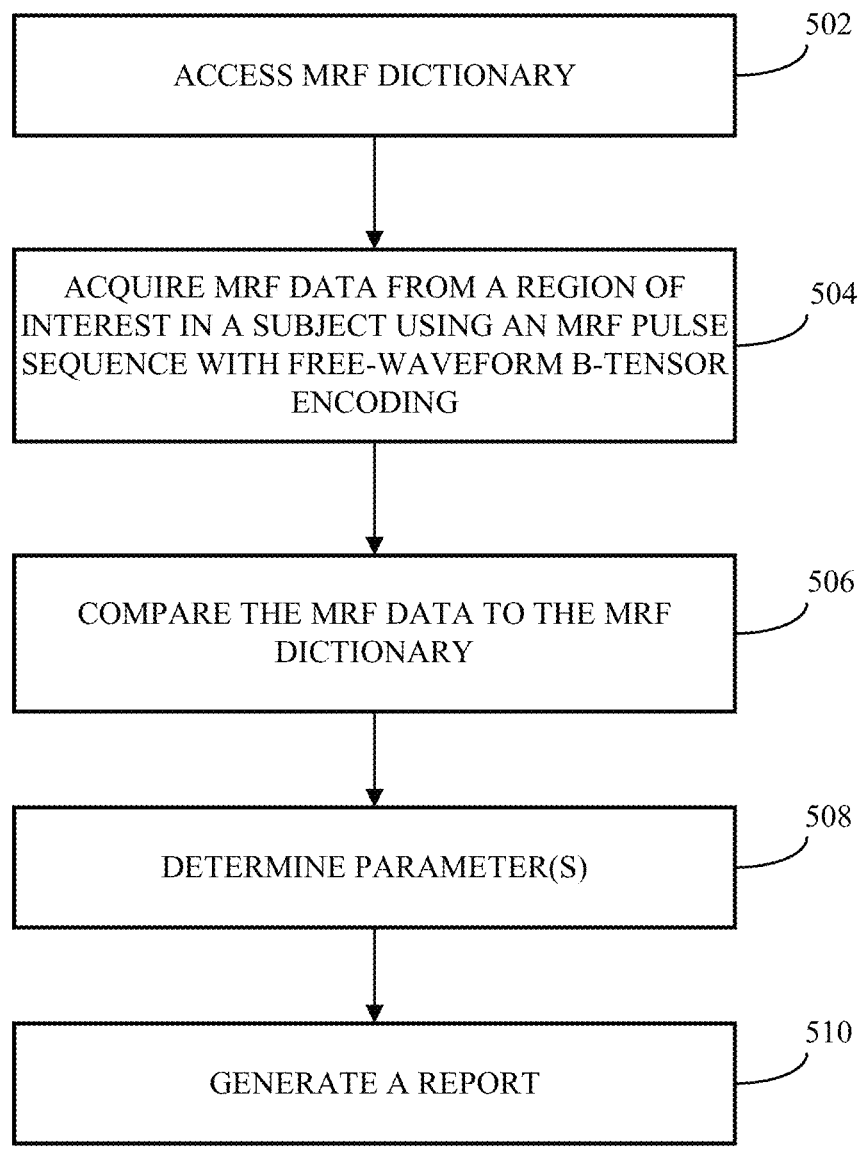
FIG. 5 illustrates a method for multi-dimensional, relaxation-diffusion magnetic resonance fingerprinting (MRF) in accordance with an embodiment.

FIG. 5 illustrates a method for multi-dimensional, relaxation-diffusion magnetic resonance fingerprinting (MRF) in accordance with an embodiment. Although the blocks of the process in FIG. 5 are illustrated in a particular order, in some embodiments, one or more blocks may be executed in a different order than illustrated in FIG. 5, or may be bypassed. At block 502, an MRF dictionary may be accessed. In some embodiments, the MRF dictionary may be stored in and retrieved from a memory or data storage of, for example, an MRI system (e.g., the MRI system 100 shown in FIG. 1) or other computer system. As used herein, the term "accessing" may refer to any number of activities related to generating, retrieving or processing the MRF dictionary using, for example, MRI system 100 (shown in FIG. 1), an external network, information repository, or combination thereof. In some embodiments, the MRF dictionary can include known signal evolutions (e.g., simulated signal evolutions) and includes parameters and properties (e.g., quantitative parameter or property values) associated with each signal evolution, for example, $T_1$, $T_2$, proton density ($M_0$), off-resonance, diffusivity or diffusion tensor. In some embodiments, the MRF dictionary may be generated using a Bloch simulation or Bloch-Torrey equation.

At block 504, MRF data (e.g., MRF signal evolutions) may be acquired from a tissue in a region of interest in a subject using, for example, an MRI system (e.g., MRI system 100 shown in FIG. 1). The MRF data may be acquired using an MRF pulse sequence for multi-dimensional, relaxation-diffusion magnetic resonance fingerprinting (MRF), for example, the md-MRF pulse sequence described above with respect to FIGS. 2-4. Acquiring MRF data may include, for example, performing or playing-out the multi-dimensional, relaxation-diffusion MRF pulse sequence using an MRI system (e.g., MRI system 100 shown in FIG. 1). In some embodiment, the md-MRF pulse sequence 200 may be implemented with one or more b-tensor diffusion encoding geometries such as, for example, linear tenor encoding (LTE) and spherical tensor encoding (STE). The acquired MRF data may be stored in memory or data storage of, for example, an MRI system (e.g., the MRI system shown in FIG. 1) or other computer system.

The MRF data acquired at block 504 may then be compared to the MRF dictionary at block 506 to match the acquired signal evolutions with signal evolutions stored in the MRF dictionary. "Match" as used herein refers to the result of comparing signals. "Match" does not refer to an exact match, which may or may not be found. A match may be the signal evolution that mode closely resembles another signal evolution. Comparing the MRF data to the MRF dictionary may be performed in a number of ways such as, for example, using a pattern matching, template matching or other matching algorithm. In some embodiments, dot product pattern matching may be used to select the MRF dictionary entry which most closely fits the acquired signal evolutions to extract $T_1$, $T_2$, and diffusivity or diffusion tensor for each pixel. In some embodiments, the inner products between the normalized measured time course of each pixel and all entries of the normalized dictionary are calculated, and the dictionary entry corresponding to the maximum value of the inner product is taken to represent the closest signal evolution to the acquired signal evolution. In some embodiments, iterative pattern matching may be used.

At block 508, relaxation and diffusion parameters may be determined based on the acquired MRF data (e.g., the MR signal evolutions). In some embodiments one or more parameters or properties of the acquired MRF data may be determined based on the comparison and matching at block 506. For example, based on the comparison and matching in block 506, the signal evolution (i.e., a dictionary entry) that is determined to be the closest signal evolution (or closest fit) to the acquired signal evolutions may be selected and the parameters associated with the selected dictionary entry assigned to the acquired signal evolutions. As described above, the parameters may include longitudinal relaxation time ($T_1$), transverse relaxation time ($T_2$), and diffusivity or diffusion tensor. In some embodiments, other parameters may be determined from the comparison and matching, such as main or static magnetic field ($B_0$) and proton density ($M_0$). In some embodiments, at block 508, one or more diffusion or diffusivity parameters may be determined using the parameters (e.g., diffusivity or diffusion tensor) determined from the dictionary matching at block 506. For example, in some embodiments, known methods may be used to determine quantitative values for mean diffusivity (MD), apparent diffusion coefficient (ADC), fractional anisotropy (FA), microscopic fractional anisotropy (µFA), or other microstructure related parameters, such as for example, axon diameters, cell density, tissue partial volume, and volume fraction from the parameters (e.g., diffusivity or diffusion tensor) determined from the dictionary matching at block 506. In an example, the ADC may be calculated by averaging the diffusivity from three diffusion encoding directions. In another example, the fractional anisotropy may be calculated using a known model of axial diffusivity and radial diffusivity. In yet another example, the microscopic fractional anisotropy may be calculated using known models of diffusivity.

At block 510, a report may be generated indicating at least one of the determined relaxation and diffusion parameters for the tissue in a region of interest in a subject. For example, a report may include a quantitative indication of the at least one parameter. The report may include, for example, images or maps, text or metric based reports, audio reports and the like. The report may be provided to and displayed on a display (e.g., display 104, 136 or 144 shown in FIG. 1).

The following examples set forth, in detail, ways in which the present disclosure was evaluated and ways in which the present disclosure may be used or implemented, and will enable one of ordinary skill in the art to more readily understand the principles thereof. The following examples are presented by way of illustration and are not meant to be limiting in any way.

In this example, the above-described multi-dimensional MRF (md-MRF) sequence 200 was designed with multiple preparation modules including inversion with multiple TI times, $T_2$ preparations with multiple TE times and diffusion preparations with multiple b-shells. After each preparation module, 48 images were acquired with varying flip angles using single-shot spiral readouts. The timings and b-values of such preparation and readout units in this example implementation were as follows.

| Reference Number | Value |
| --- | --- |
| 202 | TI = 21 |
| 204 | TI = 21 |
| 206 | TE = 30 |
| 208 | TE = 50 |
| 210 | TE = 80 |
| 212 | b = 200 |
| 214 | b = 800 |
| 216 | b = 1500 |

In this example, the md-MRF pulse sequence was implemented with linear tensor diffusion encoding (LTE) and spherical tensor diffusion encoding (STE) separately. In this example, the STE gradient waveforms, (e.g., waveform 300 shown in FIG. 3), were designed with eddy current and concomitant field compensation, such as described in Sjolund, Jens, et al. "Constrained optimization of gradient waveforms for generalized diffusion encoding." Journal of magnetic resonance 261 (2015): 157-168, and Yang, Grant, and Jennifer A. McNab. "Eddy current nulled constrained optimization of isotropic diffusion encoding gradient waveforms." Magnetic resonance in medicine 81.3 (2019): 1818-1832, each of which is incorporated herein by reference. In the md-MRF scan performed using these parameters and with LTE diffusion preparations (md-MRF-LTE), the acquisition units (e.g., as shown in FIG. 4) were repeated multiple times with varying sampling directions. Because STE already measures isotropic diffusion, no gradient rotation was applied in the md-MRF-STE scan for this example.

In this example, md-MRF-LTE and md-MRF-STE scans were performed on a relaxation-diffusion phantom, a microstructure phantom and in vivo. In this example, the microstructure phantom had 6 samples where each includes one (#1, #5, #6) or two (#2, #3, #4) blocks of-24 fiber layers (10 mm×10 mm) inside a 15 ml centrifuge tube filled with deionized water. There was also a free water phantom in the middle labeled with number 0.

Figures 6A, 6B, 6C:
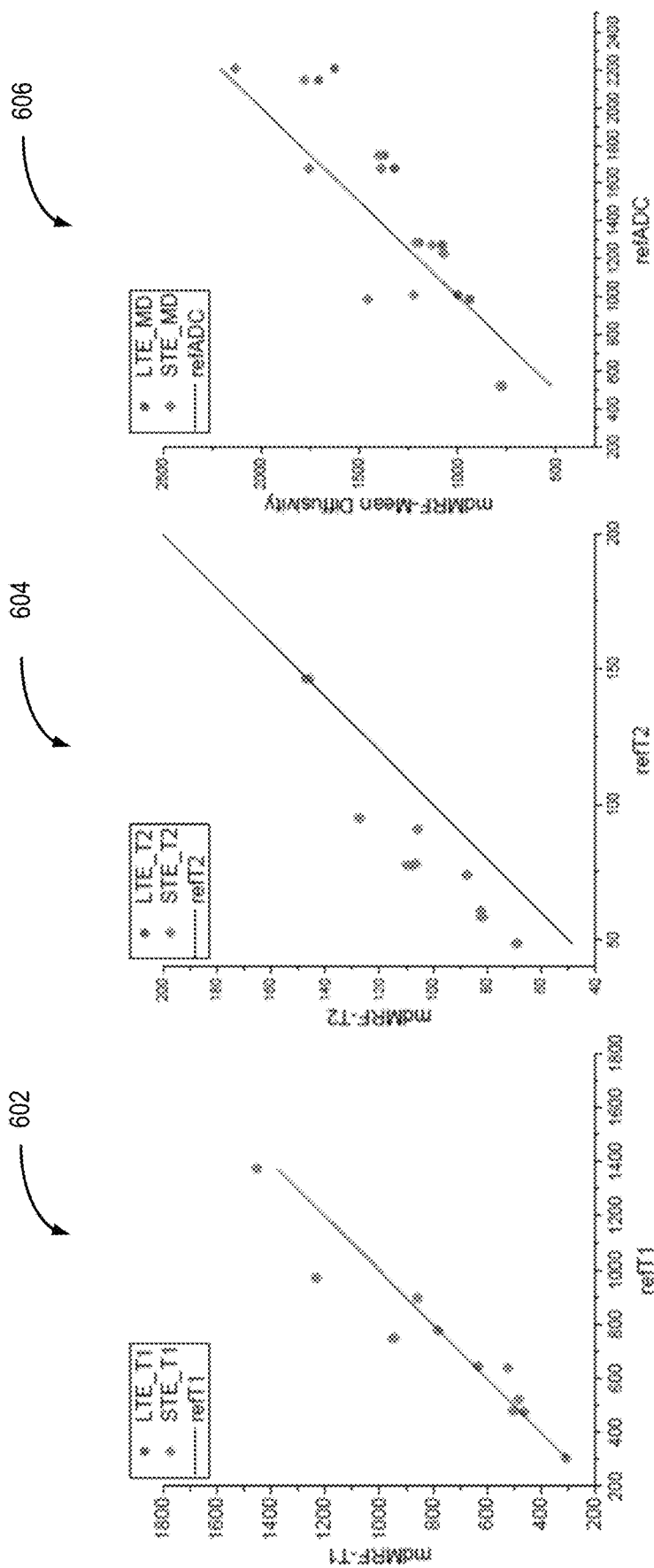
FIGS. 6A-6C show example graphs of $T_1$, $T_2$, and ADC values from a multi-dimensional, relaxation-diffusion MRF acquisition in accordance with an embodiment.

The results from the phantom scans were compared to those from conventional b-tensor diffusion scans. Results from the phantom studies in this example are provided in FIGS. 6A-6C. Specifically, FIGS. 6A-6C show graphs of the $T_1$ (602), $T_2$, (604) and ADC (606) values of a relaxation-diffusion phantom acquired using md-MRF-LTE and md-MRF-STE acquisitions and contrasted with those from the standard measurement. For the isotropic diffusion phantom, in this example, the $T_1$, $T_1$, and diffusivity results from md-MRF-LTE and STE are in good agreement.

Figure 7:
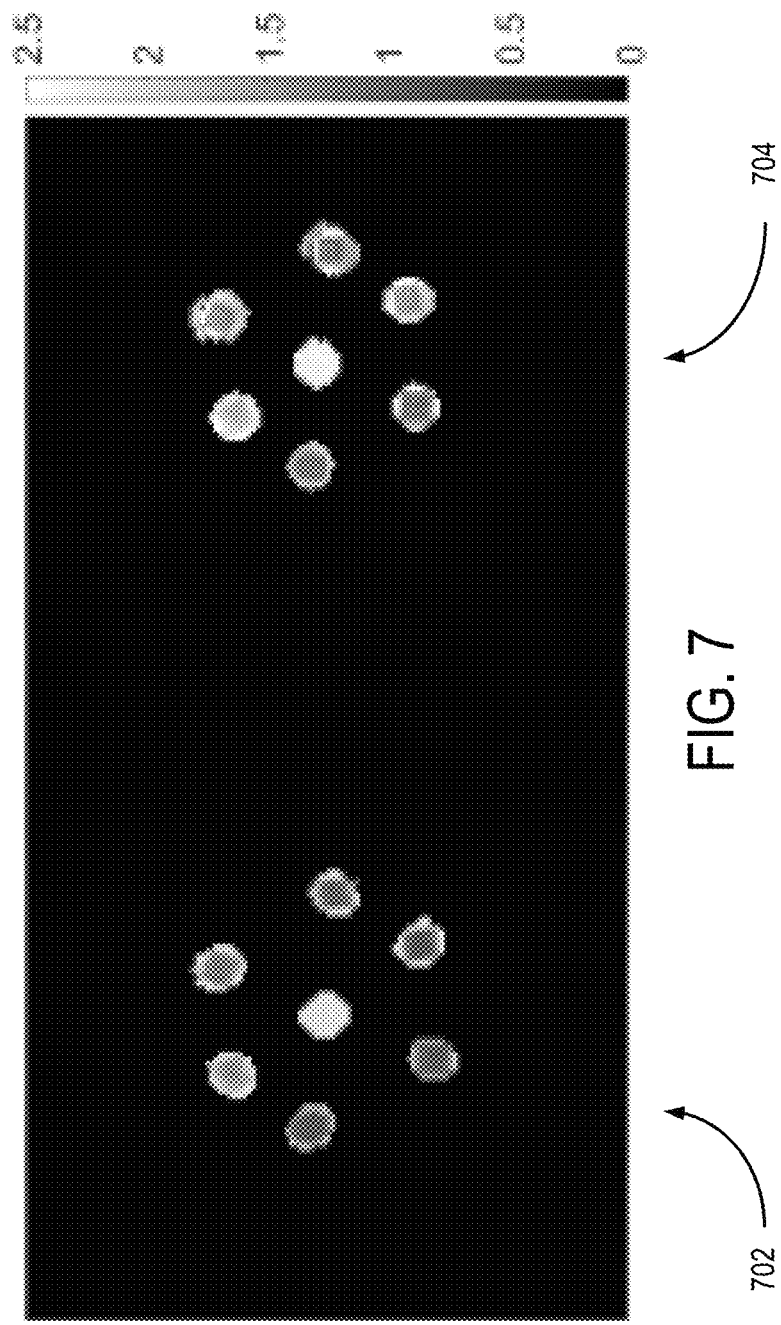
FIG. 7 shows an example comparison of ADC maps from a conventional diffusion acquisition and a multi-dimensional, relaxation-diffusion MRF acquisition using LTE.

Images of the microstructure phantom produced using the above-acquisitions in this example are illustrated in FIG. 7. The ADC maps 702 were obtained using conventional diffusion MRI while the ADC maps 704 were acquired using the above-described md-MRF-LTE acquisition. In the ADC maps 702 and 704, estimated ADC is shown in $mm^2/ms$ from the microstructure phantom using conversional linear tensor acquisition (ADC maps 702) and the md-MRF-LTE acquisition (ADC maps 704). As can be readily seen, in this example, there is a good agreement between the contrast of the ADC maps from conventional MRI and the one from md-MRF-LTE acquisition.

In this example, for the in vivo scans, the md-MRF-LTE acquisition was performed with 20 diffusion directions and the md-MRF-STE acquisition was performed with one direction. The image resolution was $1.5 \times 1.5$ mm$^2$ and 5 mm slice thickness. In this example, the scan time of the md-MRF-LTE acquisition was five minutes and the scan time of the md-MRF-STE acquisition was 50 seconds. The data from the md-MRF-LTE acquisition was used to quantify $T_1$, $T_2$, ADC, FA, and proton density maps simultaneously and the data from the md-MRF-STE acquisition was used to quantify $T_1$, $T_2$, ADC, and proton density maps.

With respect to the in vivo acquisitions, FIGS. 8A and 8B shows the $T_1$ map 802, $T_2$ map 804, ADC map 806 and FA map 808 from the md-MRF-LTE scan and $T_1$ map 810, $T_2$ map 812, ADC map 814, $M_0$ map 816 from the md-MRF-STE scan. In particular, estimated diffusion and relaxometry parameters are illustrated, whereby FIG. 8A provides the $T_1$ and $T_2$ relaxation times and apparent diffusion coefficient (ADC) and fractional anisotropy (FA) from a single slice of the md-MRF acquisition using the linear tensor encoding (LTE). On the other hand, FIG. 8B shows the results of the md-MRF acquisition using the spherical tensor encoding (STE), illustrating $T_1$, $T_2$, ADC, and $M_0$.

Computer-executable instructions for multi-dimensional, relaxation-diffusion magnetic resonance fingerprinting (MRF) according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for multi-dimensional, relaxation-diffusion magnetic resonance fingerprinting (MRF), the method comprising:

performing, using a magnetic resonance imaging (MRI) system, a pulse sequence that integrates free-waveform b-tensor diffusion encoding into a magnet resonance fingerprinting pulse sequence to perform a multi-dimensional, relaxation-diffusion encoding while acquiring MRF signal evolutions;

processing, using a processor, the acquired MRF signal evolutions to determine at least one relaxation parameter and at least one diffusivity parameter; and generating, using the processor, a report including at least one of the at least one relaxation parameter and the at least diffusivity parameter.

2. The method according to claim 1, wherein the at least one relaxation parameter includes at least one of $T_1$, $T_2$, or $M_0$.

3. The method according to claim 2, wherein processing the acquired MRF signal evolutions to determine the at least one relaxation parameter comprises:

accessing, using the processor, an MRF dictionary; and
comparing, using the processor, the acquired MRF signal evolutions to the MRF dictionary to identify at least one of $T_1$, $T_2$, $M_0$, for the MRF signal evolutions.

4. The method according to claim 1, wherein the at least one diffusivity parameter includes at least one of mean diffusivity (MD), apparent diffusion coefficient (ADC), fractional anisotropy (FA), microscopic fraction anisotropy (FA), axon diameter, cell density, tissue partial volume fractions.

5. The method according to claim 1, wherein processing the acquired MRF signal evolutions to determine the at least one diffusivity parameter comprises:

accessing, using the processor, an MRF dictionary;
comparing, using the processor, the acquired MRF signal evolutions to the MRF dictionary to identify diffusivity for the MRF signal evolutions; and
processing, using the processor, the diffusivity to identify the at least one diffusivity parameter for the acquired MRF signal evolutions.

6. The method according to claim 5, wherein the at least one diffusivity parameter includes at least one of mean diffusivity (MD), apparent diffusion coefficient (ADC), fractional anisotropy (FA), microscopic fraction anisotropy (µFA), axon diameter, cell density, and tissue partial volume fractions.

7. The method according to claim 1, wherein the free-waveform b-tensor diffusion encoding effectuates multiple geometries of b-tensor gradient encoding.

8. The method according to claim 7, wherein the multiple geometries of b-tensor gradient encoding include linear tensor encoding and spherical tensor encoding.

9. A magnetic resonance imaging (MRI) system comprising:

a magnet system configured to generate a polarizing magnetic field about a portion of a subject positioned;
a magnetic gradient system including a plurality of magnetic gradient coils configured to apply at least one magnetic gradient field to the polarizing magnetic field;
a radio frequency (RF) system configured to apply an RF excitation field to the subject, and to receive magnetic resonance signals from the subject using a coil array;
at least one processor configured to:
perform a pulse sequence that integrates free-waveform b-tensor diffusion encoding into a magnet resonance fingerprinting pulse sequence to perform a multi-dimensional, relaxation-diffusion encoding while acquiring MRF signal evolutions; and
process the MRF signal evolutions to determine at least one relaxation parameter and at least one diffusivity parameter.

10. The method according to claim 9, wherein the at least one relaxation parameter includes at least one of $T_1$, $T_2$, or $M_0$.

11. The MRI system according to claim 10, wherein the processor is further configured to:

access an MRF dictionary; and
compare the acquired MRF signal evolutions to the MRF dictionary to identify at least one of $T_1$, $T_2$, or $M_0$ for the MRF signal evolutions.

12. The MRI system according to claim 9, wherein the processor is further configured to generate a report including at least one of the at least one relaxation parameter and at least one diffusivity parameter.

13. The MRI system according to claim 9, wherein the at least one diffusivity parameter includes at least one of mean diffusivity (MD), apparent diffusion coefficient (ADC), fractional anisotropy (FA), microscopic fraction anisotropy (µFA), axon diameter, cell density, and tissue partial volume fractions.

14. The MRI system according to claim 9, wherein the processor is further configured to:

access an MRF dictionary;
compare the acquired MRF signal evolutions to the MRF dictionary to identify diffusivity for the MRF signal evolutions; and
process the diffusivity to identify the at least one diffusivity parameter for the acquired MRF signal evolutions.

15. The MRI system according to claim 14, wherein the at least one diffusivity parameter includes at least one of mean diffusivity (MD), apparent diffusion coefficient (ADC), fractional anisotropy (FA), microscopic fraction anisotropy (µFA), axon diameter, cell density, and tissue partial volume fractions.

16. The MRI system according to claim 9, wherein the free-waveform b-tensor diffusion encoding effectuates multiple geometries of b-tensor gradient encoding.

17. The MRI system according to claim 16, wherein the multiple geometries of b-tensor gradient encoding include linear tensor encoding and spherical tensor encoding.

* * * * *

UNITED STATES PATENT AND TRADEMARK OFFICE
CERTIFICATE OF CORRECTION

PATENT NO.       : 11,768,264 B2
APPLICATION NO.  : 17/661736
DATED            : September 26, 2023
INVENTOR(S)      : Dan Ma et al.

It is certified that error appears in the above-identified patent and that said Letters Patent is hereby corrected as shown below:

In the Claims

Claim 4, Column 13, Line 21, "(FA), axon diameter, cell density, tissue partial volume" should be --($\mu$FA), axon diameter, cell density, tissue partial volume--.

Signed and Sealed this
Twenty-seventh Day of February, 2024

Katherine Kelly Vidal
*Director of the United States Patent and Trademark Office*